US012610458B2

(12) United States Patent
Park et al.

(10) Patent No.: US 12,610,458 B2
(45) Date of Patent: Apr. 21, 2026

(54) FLEXIBLE PRINTED CIRCUIT BOARD, COF MODULE, AND ELECTRONIC DEVICE COMPRISING THE SAME

(71) Applicant: LG INNOTEK CO., LTD., Seoul (KR)

(72) Inventors: Ki Tae Park, Seoul (KR); Chae Won Kang, Seoul (KR); Man Ki Son, Seoul (KR)

(73) Assignee: LG INNOTEK CO., LTD., Seoul (KR)

( * ) Notice: Subject to any disclaimer, the term of this patent is extended or adjusted under 35 U.S.C. 154(b) by 24 days.

(21) Appl. No.: 18/601,312

(22) Filed: Mar. 11, 2024

(65) Prior Publication Data

US 2024/0215156 A1      Jun. 27, 2024

Related U.S. Application Data

(63) Continuation of application No. 17/933,704, filed on Sep. 20, 2022, now Pat. No. 11,968,779.

(30) Foreign Application Priority Data

Sep. 23, 2021      (KR) ........................ 10-2021-0125888

(51) Int. Cl.
*H05K 1/02*            (2006.01)
*H05K 3/28*            (2006.01)

(52) U.S. Cl.
CPC ........... *H05K 1/0296* (2013.01); *H05K 1/028* (2013.01); *H05K 3/28* (2013.01); *H05K 2201/10128* (2013.01)

(58) Field of Classification Search
CPC ........ H05K 1/02; H05K 1/0296; H05K 1/028; H05K 3/28; H05K 2201/10128

(Continued)

(56) References Cited

U.S. PATENT DOCUMENTS

2002/0184757 A1    12/2002  Lee et al.
2020/0243474 A1     7/2020  Jung

FOREIGN PATENT DOCUMENTS

CN        101330063 A     12/2008
CN        104516584 A      4/2015
(Continued)

OTHER PUBLICATIONS

Notice of Allowance dated Dec. 12, 2023 in U.S. Appl. No. 17/933,704.

(Continued)

*Primary Examiner* — Tremesha W Burns
(74) *Attorney, Agent, or Firm* — Saliwanchik, Lloyd & Eisenschenk

(57)            ABSTRACT

A flexible printed circuit board according to an embodiment includes: a substrate; a conductive pattern disposed on the substrate; and a protective layer disposed on the conductive pattern. An upper surface of the substrate includes a first edge and a second edge facing along a first direction and each extending along a second direction perpendicular to the first direction, a lower surface of the protective layer includes a fifth edge positioned adjacent to the first edge, and a sixth edge facing the fifth edge along the first direction and positioned adjacent to the second edge. The first edge and the fifth edge are spaced apart from each other along the first direction, and the conductive pattern includes a first outer pattern extending along the first direction including at least a portion disposed between the first edge and the fifth edge.

20 Claims, 10 Drawing Sheets

(58) Field of Classification Search
    USPC .......................................................... 361/749
    See application file for complete search history.

(56)                       References Cited

FOREIGN PATENT DOCUMENTS

| JP | 2006-118896 A | 5/2006 |
| KR | 10-2004-0110733 A | 12/2004 |
| KR | 10-2020-0092016 A | 8/2020 |

OTHER PUBLICATIONS

Office Action dated Dec. 9, 2025 in Chinese Application No. 202211163718.3.

FLEXIBLE PRINTED CIRCUIT BOARD, COF MODULE, AND ELECTRONIC DEVICE COMPRISING THE SAME

CROSS-REFERENCE TO RELATED APPLICATION

This application is a continuation of U.S. application Ser. No. 17/933,704, filed Sep. 20, 2022; which claims priority under 35 U.S.C. 119 and 35 U.S.C. 365 to Korean Patent Application No. 10-2021-0125888, filed Sep. 23, 2021, which is hereby incorporated by reference in its entirety.

TECHNICAL FIELD

An embodiment relates to a flexible printed circuit board, a COF module, and an electronic device including the same. In detail, the flexible printed circuit board may be a flexible printed circuit board for COF.

BACKGROUND ART

In recent years, various electronic products have become thinner, smaller and lighter. Accordingly, various researches are being conducted in order to mount a semiconductor chip at a high density in a narrow region of an electronic product.

Among them, since a chip on film (COF) method uses a flexible substrate, the COF method may be applied to both a flat panel display and a flexible display. That is, since the COF method may be applied to various wearable electronic devices, the COF method is attracting attention. In addition, since the COF method may realize a fine pitch, the COF method may be used to realize a high-resolution display (QHD as the number of pixel increases.

A chip on film (COF) is a method in which a semiconductor chip is mounted on a flexible printed circuit board in the form of a thin film. For example, the semiconductor chip may be an integrated circuit (IC) chip or a large-scale integrated circuit (LSI) chip.

Meanwhile, the chip may be connected to an external PCB and a display panel through a wiring electrode. For example, a pad portion may be disposed on one end and the other end of the wiring electrode, respectively, one pad portion may be electrically connected to a terminal of the chip, and the other pad portion may be connected to terminals of the PCB and the display panel. Accordingly, the chip, the PCB, and the display panel may be electrically connected through the COF, and a signal may be transmitted to the display panel through the wiring electrode.

Meanwhile, a protective layer may be disposed on the circuit pattern in order to protect the wiring electrode. The circuit pattern may inhibit external impact and contact with moisture and impurities by the protective layer, thereby improving the reliability of the COF.

Meanwhile, the protective layer may not be disposed on the pad portion, which is a region connected to the PCB and the display panel in a region of the circuit pattern, for connection. When the protective layer is disposed beyond a set position in a process of disposing the protective layer, a size of the pad portion may be increased by an excess size, thereby unnecessarily increasing a size of the COF.

Therefore, a flexible printed circuit board having a new structure capable of solving the above problems is required.

SUMMARY

Technical Problem

An embodiment is directed to providing a flexible printed circuit board having improved reliability, a COF module, and an electronic device including the same.

Technical Solution

A flexible printed circuit board according to an embodiment includes: a substrate; a circuit pattern disposed on the substrate; and a protective layer on the circuit pattern, wherein the circuit pattern includes a first circuit pattern and a second circuit pattern connected to a chip in a chip mounting region, a first direction that is a direction in which the circuit pattern extends and a second direction perpendicular to the first direction are defined in the substrate, the substrate includes first and second ends facing each other in the first direction and third and fourth ends facing each other in the second direction, the protective layer includes fifth and sixth ends spaced apart from ends of the substrate and facing in the first direction and seventh and eighth ends spaced apart from ends of the substrate and facing in the second direction, and an outer pattern disposed adjacent to the third end and the fourth end on the substrate, wherein the outer pattern includes: a first outer pattern and a second outer pattern adjacent to a pad portion of the first circuit pattern and facing in the second direction; and a third outer pattern and a fourth outer pattern adjacent to a pad portion of the second circuit pattern and facing in the second direction, the first outer pattern includes a first pattern portion and a second pattern portion spaced apart from each other, the second outer pattern includes a third pattern portion and a fourth pattern portion spaced apart from each other, the third outer pattern includes a fifth pattern portion and a sixth pattern portion spaced apart from each other, the fourth outer pattern includes a seventh pattern portion and an eighth pattern portion spaced apart from each other, and a fifth end of the protective layer is disposed between the first pattern portion and the second pattern portion and between the third pattern portion and the fourth pattern portion.

Advantageous Effects

A flexible printed circuit board according to an embodiment can include a plurality of outer patterns, and each outer pattern may can include a plurality of pattern portions spaced apart from each other.

Accordingly, when a protective layer is disposed, it is possible to easily control a position of the protective layer in a first direction.

That is, the position of the protective layer can be adjusted so that an end of the protective layer is disposed between the pattern portions. Accordingly, the position of the protective layer can be easily controlled to a position to be implemented by the pattern portion.

Therefore, it is possible to inhibit bonding regions of a first circuit pattern and a second circuit pattern from decreasing due to disposition of the position of the protective layer beyond the position to be implemented. In addition, it is possible to inhibit a region in which the protective layer is not disposed in a wiring portion from occurring due to disposition of the position of the protective layer below the position to be implemented.

Accordingly, the flexible printed circuit board according to the embodiment, can easily control the position of the protective layer by the plurality of pattern portions formed on the outer pattern. Therefore, the flexible printed circuit board according to the embodiment can improve bonding characteristics and have improved reliability by inhibiting corrosion of circuit patterns.

BRIEF DESCRIPTION OF THE DRAWINGS

FIG. 9 is a top view in which a circuit pattern is omitted in the flexible printed circuit board according to the second embodiment.

DETAILED DESCRIPTION OF THE EMBODIMENTS

Hereinafter, embodiments of the present disclosure will be described in detail with reference to the accompanying drawings. However, the spirit and scope of the present disclosure is not limited to a part of the embodiments described, and may be implemented in various other forms, and within the spirit and scope of the present disclosure, one or more of the elements of the embodiments may be selectively combined and replaced.

In addition, unless expressly otherwise defined and described, the terms used in the embodiments of the present disclosure (including technical and scientific terms) may be construed the same meaning as commonly understood by one of ordinary skill in the art to which this invention belongs, and the terms such as those defined in commonly used dictionaries may be interpreted as having a meaning that is consistent with their meaning in the context of the relevant art.

In addition, the terms used in the embodiments of the present disclosure are for describing the embodiments and are not intended to limit the present disclosure. In this specification, the singular forms may also include the plural forms unless specifically stated in the phrase, and may include at least one of all combinations that may be combined in A, B, and C when described in "at least one (or more) of A (and), B, and C".

Further, in describing the elements of the embodiments of the present disclosure, the terms such as first, second, A, B, (a), and (b) may be used. These terms are only used to distinguish the elements from other elements, and the terms are not limited to the essence, order, or order of the elements.

In addition, when an element is described as being "connected" or "coupled" to another element, it may include not only when the element is directly "connected" or "coupled" to other elements, but also when the element is "connected" or "coupled" by another element between the element and other elements.

Further, when described as being formed or disposed "on (over)" or "under (below)" of each element, the "on (over)" or "under (below)" may include not only when two elements are directly connected to each other, but also when one or more other elements are formed or disposed between two elements.

Furthermore, when expressed as "on (over)" or "under (below)", it may include not only the upper direction but also the lower direction based on one element.

Hereinafter, a flexible printed circuit board, a COF module, and an electronic device including the same according to an embodiment will be described with reference to the drawings.

Figure 1:
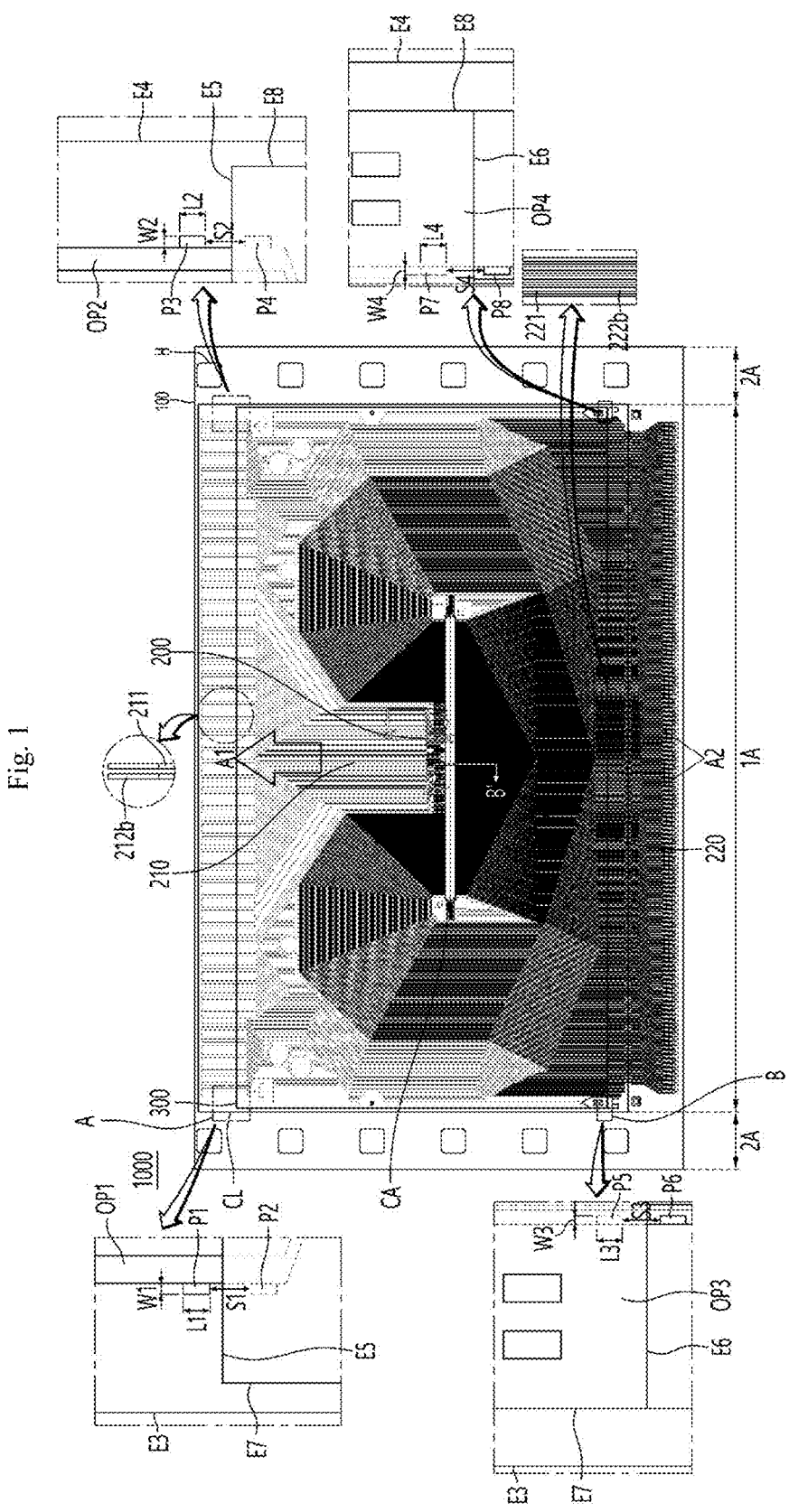
FIG. 1 is a top view of a flexible printed circuit board according to an embodiment.
Figures 2, 3:
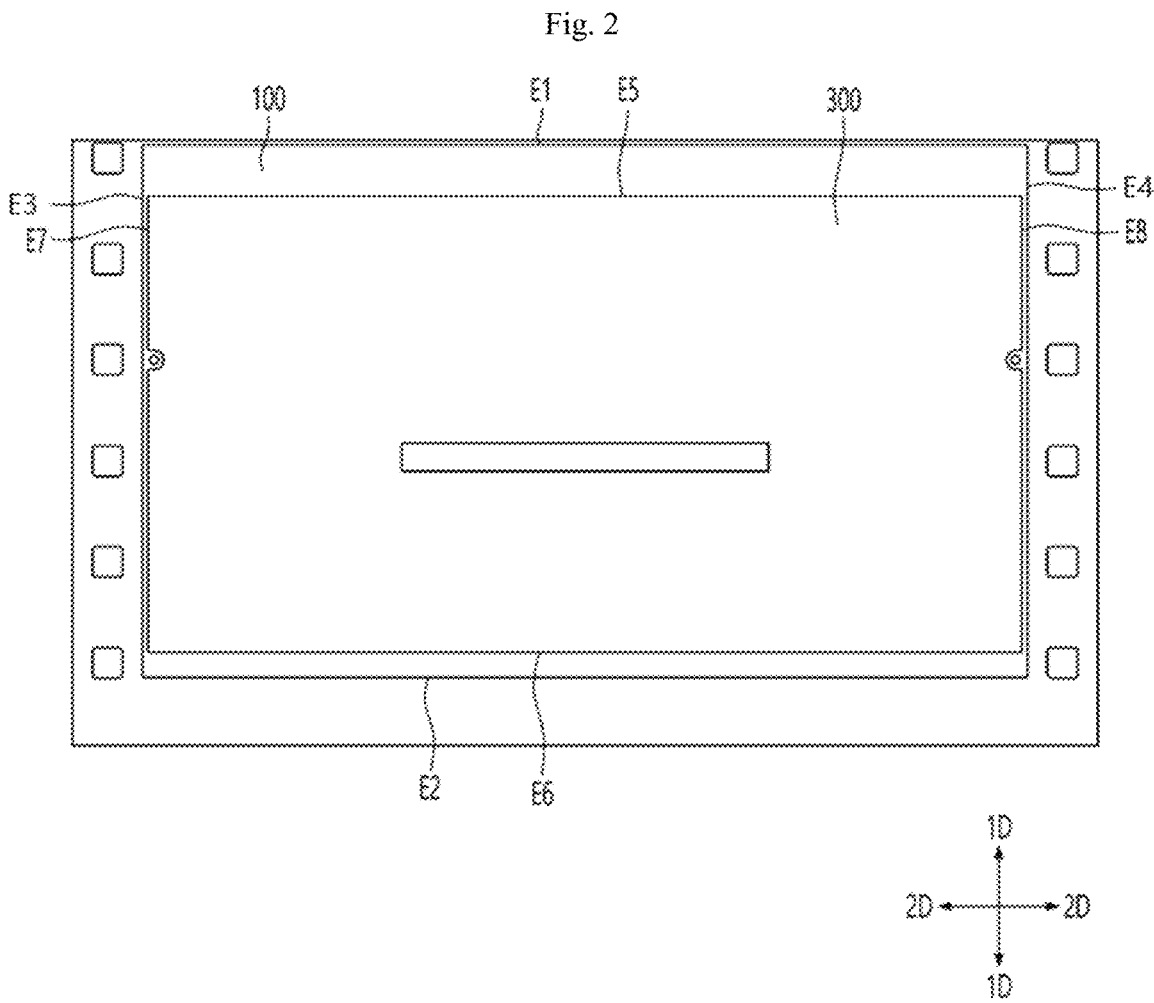
FIG. 2 is a top view in which a circuit pattern is omitted in a flexible printed circuit board according to a first embodiment.
FIGS. 3 and 4 are cross-sectional views taken along line A-A' in FIG. 1.

FIGS. 1 and 2 are top views of a flexible printed circuit board according to an embodiment.

Referring to FIGS. 1 and 2, a flexible printed circuit board 1000 according to the embodiment may include a substrate 100 and a circuit pattern 200 disposed on the substrate 100.

The substrate 100 may include a flexible substrate. For example, the substrate 100 may be a polyimide (PI) substrate. However, the embodiment is not limited thereto, and the substrate 100 may include a polymer material such as polyethylene terephthalate (PET), polyethylene naphthalate (PEN), or the like. Accordingly, the flexible printed circuit board including the substrate 100 may be used in various electronic devices having a curved display device. For example, the flexible printed circuit board including the substrate 100 is excellent in flexible characteristics, thereby mounting a semiconductor chip of a wearable electronic device The substrate 100 may have a thickness of 20 μm to 100 μm. For example, the substrate 100 may have a thickness of 25 μm to 50 μm. For example, the substrate 100 may have a thickness of 30 μm to 40 μm. When the thickness of the substrate 100 exceeds 100 μm, the overall thickness of the flexible printed circuit board may be increased. Accordingly, the flexible characteristics may be deteriorated. In addition, when the thickness of the substrate 100 is less than 20 μm, the substrate 100 may be vulnerable to heat/pressure applied to the substrate 100 in a process of mounting a chip.

The substrate 100 may include a first region 1A and a second region 2A. For example, the first region 1A may be a central region of the substrate 100, and the second region 2A may be an outer region of the substrate 100. That is, the first region 1A may be disposed between second regions 2A.

The first region 1A may include a chip mounting region CA. In detail, the first region 1A may include the chip mounting region CA in which a chip C connected to the circuit pattern is mounted.

In addition, circuit patterns 210 and 220 may be disposed on the first region 1A. In detail, a plurality of circuit patterns that are spaced apart from each other and extend in multiple directions may be disposed in the first region 1A.

The first region 1A may be a region actually used in the flexible printed circuit board 1000. That is, when the flexible printed circuit board is in contact with another panel or the like, the first region 1A may be a region that is in contact with the flexible printed circuit board.

The circuit pattern may not be disposed in the second region 2A. That is, the first region 1A and the second region 2A may be divided according to the presence of the arrangement of the circuit pattern.

The second region 2A may include a plurality of holes. In detail, the second region 2A may include a plurality of sprocket holes H. The flexible printed circuit board may be wound or unwound by the sprocket hole H in a roll-to-roll manner.

The second region 2A may be a region not actually used in the flexible printed circuit board 1000. That is, when the flexible printed circuit board is in contact with another panel or the like, the second region may be a region to be removed.

In detail, after cutting a cutting line CL defined as a boundary between the second region 2A in which the sprocket hole H is formed and the first region 1A, the flexible printed circuit board 1000 may be processed into the COF module and mounted on various electronic devices.

The circuit pattern may include a wiring portion and a pad portion. In addition, the plurality of circuit patterns may be disposed in the first region 1A. In detail, a first circuit pattern 210 and a second circuit pattern 220 may be disposed in the first region 1A.

Figure 4:
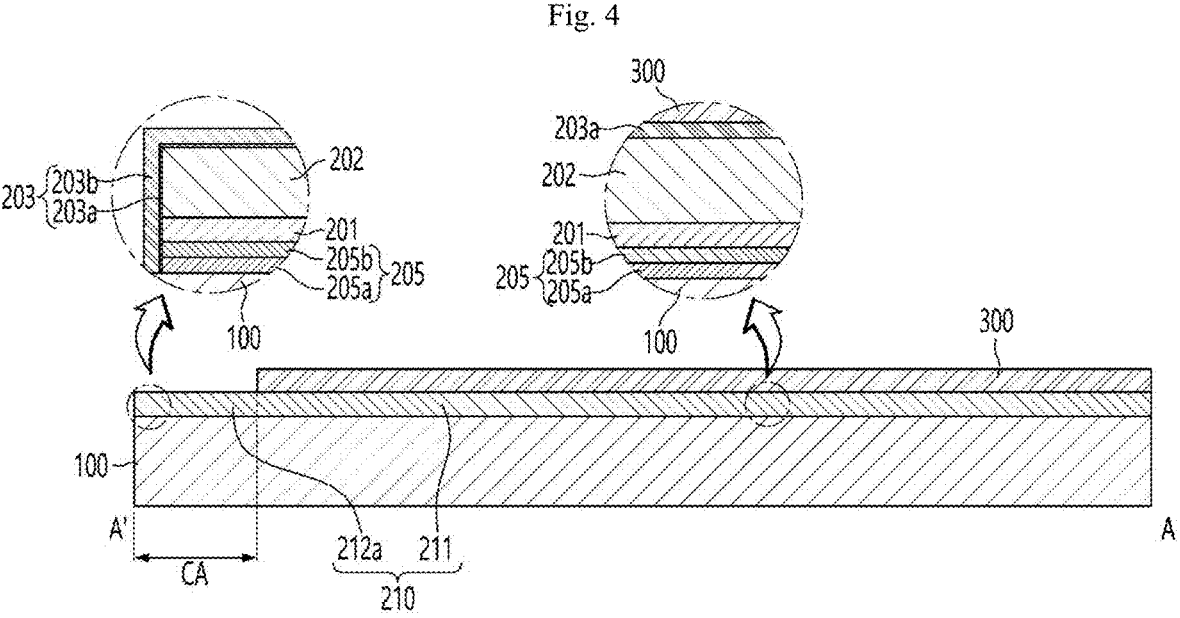

Referring to FIGS. 1, 3, and 4, the first circuit pattern 210 may include a first wiring portion 211, a first pad portion 212*a*, and a second pad portion 212*b*. In detail, the first circuit pattern 210 may include the first pad portion 212*a* disposed inside the chip mounting region CA, the second pad portion 212*b* disposed outside the chip mounting region CA, and the first wiring portion 211 disposed between the first pad portion 212*a* and the second pad portion 212*b* and connected to the first pad portion 212*a* and the second pad portion 212*b*.

The first wiring portion 211, the first pad portion 212*a*, and the second pad portion 212*b* may be integrally formed.

In addition, the first wiring portion 211 may be disposed to extend in an A1 direction A1 based on the chip mounting region CA.

The first pad portion 212*a* may be electrically connected to a chip disposed in the chip mounting region. In addition, the second pad portion 212*b* may be electrically connected to another printed circuit board. In addition, the first wiring portion 211 may transmit a signal between the chip and the printed circuit board.

A protective layer 300 may be disposed on the first circuit pattern 210. In detail, the protective layer 300 may be disposed on the first wiring portion 211. The protective layer 300 may be disposed to surround the first wiring portion 211. In addition, the protective layer 300 may not be disposed on the first pad portion 212*a* and the second pad portion 212*b*.

Figure 5:
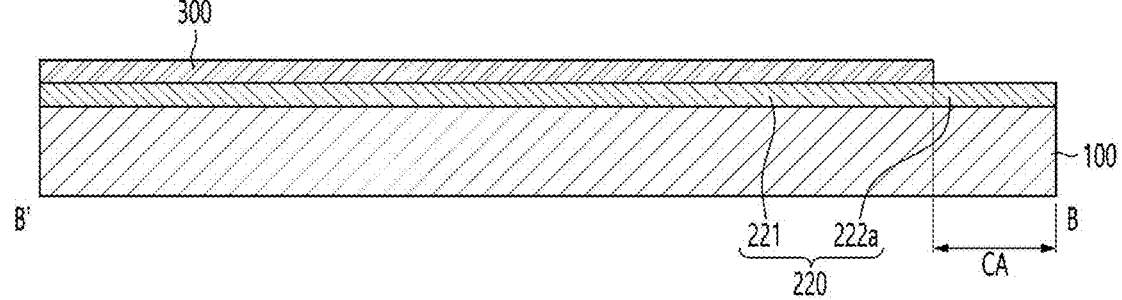
FIG. 5 is a cross-sectional view taken along line B-B' in FIG. 1.

In addition, referring to FIGS. 1 and 5, the second circuit pattern 220 may include a second wiring portion 221, a third pad portion 222*a*, and a fourth pad portion 222*b*. In detail, the second circuit pattern 220 may include the third pad portion 222*a* disposed inside the chip mounting region CA, the fourth pad portion 222*b* disposed outside the chip mounting region CA, and the second wiring portion 221 disposed between the third pad portion 222*a* and the fourth pad portion 222*b* and connected to the third pad portion 222*a* and the fourth pad portion 222*b*.

The second wiring portion 221, the third pad portion 222*a*, and the fourth pad portion 222*b* may be integrally formed.

In addition, the second wiring portion 221 may be disposed to extend in an A2 direction A2 based on the chip mounting region CA. In detail, the second wiring portion 221 may be disposed to extend in the A2 direction A2 opposite to the A1 direction A1.

The third pad portion 222*a* may be electrically connected to the chip disposed in the chip mounting region. In addition, the fourth pad portion 222*b* may be electrically connected to a display panel. In addition, the second wiring portion 211 may transmit a signal between the chip and the display panel.

The protective layer 300 may be disposed on the second circuit pattern 220. In detail, the protective layer 300 may be disposed on the second wiring portion 221. The protective layer 300 may be disposed to surround the second wiring portion 221. In addition, the protective layer 300 may not be disposed on the third pad portion 222*a* and the fourth pad portion 222*b*.

Meanwhile, the protective layer 300 may be disposed only at a set position. When the protective layer 300 is disposed beyond the set position, an area of the pad portion may be reduced, and when the protective layer 300 is disposed below the set position, the wiring portion may not be effectively protected by the protective layer.

The arrangement of the protective layer 300 at the set position will be described in detail below.

The first circuit pattern 210 and the second circuit pattern 220 may include a metal material having excellent electrical conductivity. In detail, the first circuit pattern 210 and the second circuit pattern 220 may include copper (Cu). However, the embodiment is not limited thereto, and the first circuit pattern 210 and the second circuit pattern 220 may include at least one metal among copper (Cu), aluminum (Al), and chromium (Cr), nickel (Ni), silver (Ag), molybdenum (Mo), gold (Au), titanium (Ti), and alloys thereof.

Hereinafter, a layer structure of the circuit pattern of the flexible printed circuit board according to the embodiment will be described with reference to FIGS. 2 and 3. In FIGS. 2 and 3, the first circuit pattern 210 is mainly described, but the embodiment is not limited thereto, and the description of the layer structure described in FIGS. 2 and 3 may also be similarly applied to the second circuit pattern 220.

Referring to FIG. 3, the first circuit pattern 210 may be formed in multiple layers. In detail, the first wiring portion 211 and the first pad portion 212*a* may include a first metal layer 201 and a second metal layer 202. In addition, although not shown in FIG. 2, the second pad portion 212*b* may also include the first metal layer 201 and the second metal layer 202.

The first metal layer 201 may be a seed layer of the first circuit pattern 210. In detail, the first metal layer 201 may be a seed layer formed on the substrate 100 through electroless plating using a metal material such as copper (Cu).

In addition, the second metal layer 202 may be a plating layer. In detail, the second metal layer 202 may be a plating layer formed by electrolytic plating using the first metal layer 201 as a seed layer.

A thickness of the first metal layer 201 may be smaller than a thickness of the second metal layer 202.

For example, the thickness of the first metal layer 201 may be 0.7 μm to 2 μm, and the thickness of the second metal layer 202 may be 10 μm to 25 μm.

The first metal layer 201 and the second metal layer 202 may include the same metal material. For example, the first metal layer 201 and the second metal layer 202 may include copper (Cu).

In addition, an adhesive layer 203 may be disposed on the second metal layer 202. In detail, the adhesive layer 203 may be disposed on side surfaces of the first metal layer 201 and the second metal layer 202, and an upper surface of the second metal layer 202. That is, the adhesive layer 203 may be disposed to surround the first metal layer 201 and the second metal layer 202.

The adhesive layer 203 may include a metal. In detail, the adhesive layer 203 may include tin (Sn).

The adhesive layer 203 may be formed in a thickness of 0.3 μm to 0.7 μm. A tin content of the adhesive layer 203 may be increased while extending from a lower surface in which the adhesive layer 203 and the second metal layer 202 are in contact with each other toward an upper surface thereof.

That is, since the adhesive layer 203 is disposed in contact with the second metal layer 202, the tin content may increase and the copper content may decrease from the lower surface of the adhesive layer 203 toward the upper surface thereof.

Accordingly, only pure tin may remain in a thickness range of 0.1 μm to 0.3 μm on the upper surface of the adhesive layer 203.

Terminals of the chip, the printed circuit board, and the display panel may be easily adhered to the first pad portion and the second pad portion through heat and pressure by the adhesive layer 203. That is, when heat and pressure are applied to the first pad portion and the second pad portion, while the upper surface on which pure tin remains in the adhesive layer is melted, the first pad portion and the second pad portion may be easily adhered to the terminals of the chip, the printed circuit board, and the display panel.

Accordingly, the adhesive layer 203 may not be separated from the first pad portion 212a and may become a part of the first pad portion.

The first circuit pattern 210 may be disposed in a thickness of 2 μm to 25 μm. For example, the first circuit pattern 210 may be disposed in a thickness of 5 μm to 20 μm. For example, the first circuit pattern 210 may be disposed in a thickness of 7 μm to 15 μm.

Since the process of etching the first metal layer 201 is performed by flash etching for separating the circuit patterns during the manufacturing process of the first circuit pattern 210, the finally manufactured first circuit pattern 210 and the second circuit pattern 220 may be smaller than a sum of thicknesses of the first metal layer 201, the second metal layer 202, and the adhesive layer 203.

When the thickness of the first circuit pattern 210 and the second circuit pattern 220 is less than 2 μm, the resistance of the first circuit pattern 210 and the second circuit pattern 220 may increase. When the thickness of the first circuit pattern 210 and the second circuit pattern 220 exceeds 25 μm, it may be difficult to implement a fine pattern.

Meanwhile, a buffer layer 205 may be further disposed between the substrate 100 and the first circuit pattern 210 and the second circuit pattern 220. The buffer layer 205 may improve adhesion between the substrate 100 and the first circuit pattern 210 and the second circuit pattern 220, which are dissimilar materials.

The buffer layer 205 may be formed in multiple layers. In detail, a first buffer layer 205a and a second buffer layer 205b on the first buffer layer 205a may be disposed on the substrate 100. Accordingly, the first buffer layer 205a may be in contact with the substrate 100, and the second buffer layer 205b may be disposed in contact with the first circuit pattern 210.

The first buffer layer 205a may include a material having good adhesion to the substrate 100. For example, the first buffer layer 205a may include nickel (Ni). In addition, the second buffer layer 205b may include a material having good adhesion to the first circuit pattern 210. For example, the second buffer layer 205b may include chromium (Cr).

The buffer layer 205 including the first buffer layer 205a and the second buffer layer 205b may have a thin film thickness in a nanometer unit. For example, the buffer layer 205 may have a thickness of 20 nm or less.

The adhesion between the substrate 100 and the first circuit pattern 210 which are dissimilar materials may be improved by the buffer layer 205, thereby inhibiting delamination of the first circuit pattern 210.

Meanwhile, referring to FIG. 4, the adhesive layer 203 may include a first adhesive layer 203a and a second adhesive layer 203b.

In detail, the first adhesive layer 203a may be disposed on the first wiring portion 211 and the first pad portion 212a. In addition, although not shown in the drawing, the first adhesive layer 203a may also be disposed on the second pad portion 212b. That is, the first adhesive layer 203a may be disposed on the first circuit pattern 210.

In addition, the second adhesive layer 203b may be disposed only on the first pad portion 212a and the second pad portion 212b. That is, the first wiring portion 211, the first pad portion 212a, and the second pad portion 212b may have different layer structures due to the second adhesive layer 203b.

The first adhesive layer 203a and the second adhesive layer 203b may include a metal. In detail, the first adhesive layer 203a and the second adhesive layer 203b may include tin (Sn).

The first adhesive layer 203a and the second adhesive layer 203b may be disposed to have different thicknesses. In detail, a thickness of the second adhesive layer 203b may be greater than a thickness of the first adhesive layer 203a.

For example, the first adhesive layer 203a may have a thin film thickness of 0.02 μm to 0.06 μm, and the second adhesive layer 203b may have a thickness of 0.2 μm to 0.6 μm.

When the adhesive layer is thickly disposed between the protective layer 300 and the first wiring portion 211, cracks may occur when the flexible printed circuit board is bent. Accordingly, by forming the first adhesive layer 203a between the protective layer 300 and the first wiring portion 211 to have a thin film thickness, it is possible to inhibit cracks from occurring when the flexible printed circuit board is bent.

In addition, the second adhesive layer 203b may have a higher tin content while extending from a lower surface in which the second adhesive layer 203b and the first adhesive layer 203a are in contact with each other toward an upper surface thereof.

That is, in the second adhesive layer 203b, the tin content may increase and the copper content may decrease from the lower surface of the second adhesive layer 203b toward the upper surface thereof.

Accordingly, only pure tin may remain in a thickness range of 0.1 μm to 0.3 μm on an upper surface of the second adhesive layer 203b.

Terminals of the chip, the printed circuit board, and the display panel may be easily adhered to the first pad portion and the second pad portion through heat and pressure by the second adhesive layer 203b. That is, when heat and pressure are applied to the first pad portion and the second pad portion, while the upper surface on which pure tin remains in the adhesive layer is melted, the first pad portion and the second pad portion may be easily adhered to the terminals of the chip, the printed circuit board, and the display panel.

Accordingly, the first adhesive layer 203a and the second adhesive layer 203b may not be separated from the first pad portion 212a and may become a part of the first pad portion.

Meanwhile, the protective layer 300 may be disposed on the wiring portions of the first circuit pattern 210 and the second circuit pattern 220. In detail, the protective layer 300 may be disposed to surround the first wiring portion 211 and the second wiring portion 221. That is, the protective layer 300 may be disposed on the first circuit pattern 210 and the second circuit pattern 220 except for the first pad portion, the second pad portion, the third pad portion, and the fourth pad portion.

The protective layer 300 may include solder paste. For example, the protective layer 300 may include a solder paste including a thermosetting resin, a thermoplastic resin, a filler, a curing agent, or a curing accelerator.

As described above, the protective layer 300 may be disposed on a region excluding the first pad portion 212a, the second pad portion 212b, the third pad portion 222a, and the fourth pad portion 222b. The second pad portion 212b and the fourth pad portion 222b may be regions in which a flexible printed circuit board is connected to an external printed circuit board and a display panel. That is, the substrate 100 may include a bonding region, and the second pad portion 212b and the fourth pad portion 222b may be disposed in the bonding region, respectively.

In this case, when the protective layer 300 is not disposed at the set position and is disposed beyond the set position, the protective layer 300 is positioned up to the bonding region of the substrate 100, so that an area of the bonding region may be reduced. Accordingly, the bonding reliability of the printed circuit board and the display panel may be deteriorated due to a reduction in the area of the bonding region. Alternatively, in order to sufficiently secure the bonding region, a size of the flexible printed circuit board may be unnecessarily increased.

In addition, when the protective layer 300 is not disposed at the set position and is disposed below the set position, the protective layer is not disposed to completely cover the wiring portion, and thus deformation such as corrosion of the wiring portion may occur in a wiring portion region where the protective layer is not disposed.

Hereinafter, a flexible printed circuit board having a new structure capable of solving the above problems will be described.

Referring to FIGS. 1 and 2, the substrate 100 may include a plurality of ends. Here, the end of the substrate 100 may be defined as a region extending along the cutting line CL which is the boundary between the first region 1A and the second region 2A of the substrate.

In detail, the substrate 100 may include a first end E1, a second end E2, a third end E3, and a fourth end E4. For example, the substrate 100 may include the first end E1 and the second end E2 disposed to face each other in a direction in which the first circuit pattern 210 and the second circuit pattern 220 extend and the third end E3 and the fourth end E4 connecting the first end E1 and the second end E2.

The first end E1, the second end E2, the third end E3, and the fourth end E4 may extend along the cutting line CL.

Hereinafter, a direction in which the first end E1 and the second end E2 face each other is defined as a first direction 1D, and a direction in which the third end E3 and the fourth end E4 face each other is defined as a second direction 2D.

For example, the first direction 1D may be defined as a direction in which the first circuit pattern 210 and the second circuit pattern 220 extend. The first direction 1D may be defined as a direction in which pad portions of the first circuit pattern face each other. Alternatively, the first direction 1D may be defined as a direction in which pad portions of the second circuit pattern face each other. Alternatively, the first direction 1D may be defined as a direction in which a bonding region of the first circuit pattern and a bonding region of the second circuit pattern face each other.

In addition, the first direction 1D and the second direction 2D may be perpendicular to each other.

In addition, the protective layer 300 may include a plurality of ends. In detail, the protective layer 300 may include a fifth end E5, a sixth end E6, a seventh end E7, and an eighth end E8. For example, the protective layer 300 may include the fifth end E5 spaced apart from the first end E1 of the substrate 100 and disposed to directly face to each other, the sixth end E6 spaced apart from the second end E2 of the substrate 100 and disposed to directly face to each other, the seventh end E7 spaced apart from the third end E3 of the substrate 100 and disposed to directly face to each other, and the eighth end E8 spaced apart from the fourth end E4 of the substrate 100 and disposed to directly face to each other.

In addition, the fifth end E5 and the sixth end E6 may be disposed to face each other, and the seventh end E7 and the eighth end E8 may be connected to the fifth end E5 and the sixth end E6, respectively and disposed to face each other.

That is, the fifth end E5 and the sixth end E6 may be disposed to face each other in the first direction 1D, and the seventh end E7 and the eighth end E8 may be disposed to face each other in the second direction 2D.

The flexible printed circuit board 1000 may include an outer pattern adjacent to the end. In detail, the flexible printed circuit board 1000 may include a plurality of outer patterns adjacent to the third end E3 and the fourth end E4. The outer pattern may be a pattern disposed closest to the third end E3 and the fourth end E4. Alternatively, the outer pattern may be a pattern disposed inside the pattern disposed closest to the third end E3 and the fourth end E4. In addition, the outer pattern may be a circuit pattern or a dummy pattern. In detail, the outer pattern may be at least one of the first circuit pattern 210 and the second circuit pattern 220 connected to the chip. Alternatively, the outer pattern may be a dummy pattern not connected to the chip.

For example, the outer pattern may include a first outer pattern OP1, a second outer pattern OP2, a third outer pattern OP3, and a fourth outer pattern OP4.

The first outer pattern OP1 may be adjacent to the third end E3, and the second outer pattern OP2 may be adjacent to the fourth end E4. In addition, the first outer pattern OP1 and the second outer pattern OP2 may be disposed to face each other in the second direction 2D.

In addition, the first outer pattern OP1 and the second outer pattern OP2 may be disposed adjacent to the pad portion of the first circuit pattern. That is, the first outer pattern OP1 and the second outer pattern OP2 may be disposed adjacent to the bonding region of the first circuit pattern.

In addition, the third outer pattern OP3 may be adjacent to the third end E3, and the fourth outer pattern OP4 may be adjacent to the fourth end E4. In addition, the third outer pattern OP3 and the fourth outer pattern OP4 may be disposed to face each other in the second direction 2D.

In addition, the third outer pattern OP3 and the fourth outer pattern OP4 may be disposed adjacent to the pad portion of the second circuit pattern. That is, the third outer pattern OP3 and the fourth outer pattern OP4 may be disposed adjacent to the bonding region of the second circuit pattern.

In addition, the first outer pattern OP1 and the third outer pattern OP3 may be spaced apart from each other in the first direction 1D. That is, the first outer pattern OP1 and the third outer pattern OP3 may be disposed to face each other in the first direction 1D.

In addition, the second outer pattern OP2 and the fourth outer pattern OP4 may be spaced apart from each other in the first direction 1D. That is, the second outer pattern OP2 and the fourth outer pattern OP4 may be disposed to face each other in the first direction 1D.

At least one of the first outer pattern OP1, the second outer pattern OP2, the third outer pattern OP3, and the fourth outer pattern OP4 may include a pattern portion.

In detail, the first outer pattern OP1, the second outer pattern OP2, the third outer pattern OP3, and the fourth outer pattern OP4 may all include at least one pattern portion.

The first outer pattern OP1 may include a plurality of pattern portions. In detail, the first outer pattern OP1 may include a first pattern portion P1 and a second pattern portion P2. The first pattern portion P1 and the second pattern portion P2 may be disposed to extend in one direction. In addition, the first pattern portion P1 and the second pattern portion P2 may be disposed to extend in the same direction. That is, the first pattern portion P1 and the second pattern portion P2 may be embossed portions that extend and protrude from the first outer pattern OP1 in one direction.

For example, the first pattern portion P1 and the second pattern portion P2 may be disposed to extend outward. That is, the first pattern portion P1 and the second pattern portion P2 may be disposed to extend in a direction of the third end E3 of the substrate 100.

The first pattern portion P1 and the second pattern portion P2 may be disposed to be spaced apart from each other. In detail, the first pattern portion P1 and the second pattern portion P2 may be disposed to be spaced apart from each other in the first direction 1D. In addition, the fifth end E5 of the protective layer 300 may pass between the first pattern portion P1 and the second pattern portion P2. That is, the fifth end E5 of the protective layer 300 may be disposed between the first pattern portion P1 and the second pattern portion P2.

The first pattern portion P1 and the second pattern portion P2 may be disposed to be spaced apart from each other by a set size in the first direction 1D. In detail, a first space S1 between the first pattern portion P1 and the second pattern portion P2 may be 300 μm or less. In more detail, the first space S1 between the first pattern portion P1 and the second pattern portion P2 may be 100 μm to 300 μm.

When the first space S1 exceeds 300 μm or is less than 100 μm, a distance between the first pattern portion P1 and the second pattern portion P2 becomes too large or small, and thus it is not possible to easily and precisely control a position of an end of the protective layer.

In addition, the first pattern portion P1 and the second pattern portion P2 may have a length L1 and a width W1 of a set size. For example, the length L1 and the width W1 of the first pattern portion P1 and the second pattern portion P2 may be 20 μm to 50 μm.

When the length L1 and the width W1 of the first pattern portion P1 and the second pattern portion P2 are less than 20 μm, the first pattern portion P1 and the second pattern portion P2 may not be easy to implement, and when the length L1 and the width W1 of the first pattern portion P1 and the second pattern portion P2 exceed 50 μm, a space between first pattern portion P1 and the second pattern portion P2 and another adjacent circuit pattern or the dummy pattern is narrowed, so that a short-circuit or the like occurs, and thus electrical characteristics may be deteriorated.

The second outer pattern OP2 may include a plurality of pattern portions. In detail, the second outer pattern OP2 may include a third pattern portion P3 and a fourth pattern portion P4. The third pattern portion P3 and the fourth pattern portion P4 may be disposed to extend in one direction. In addition, the third pattern portion P3 and the fourth pattern portion P4 may be disposed to extend in the same direction. That is, the third pattern portion P3 and the fourth pattern portion P4 may be embossed portions that extend and protrude from the second outer pattern OP2 in one direction.

In addition, the third pattern portion P3 and the fourth pattern portion P4 may be disposed to extend in the same or opposite directions to the first pattern portion P1 and the second pattern portion P2.

For example, the third pattern portion P3 and the fourth pattern portion P4 may be disposed to extend outward. That is, the third pattern portion P3 and the fourth pattern portion P4 may be disposed to extend in a direction of the fourth end E4 of the substrate 100.

The third pattern portion P3 and the fourth pattern portion P4 may be disposed to be spaced apart from each other. In detail, the third pattern portion P3 and the fourth pattern portion P4 may be disposed to be spaced apart from each other in the first direction 1D. In addition, the fifth end E5 of the protective layer 300 may pass between the third pattern portion P3 and the fourth pattern portion P4. That is, the fifth end E5 of the protective layer 300 may be disposed between the third pattern portion P3 and the fourth pattern portion P4. In other words, the fifth end E5 of the protective layer 300 may be disposed between the first pattern portion P1 and the second pattern portion P2 and between the third pattern portion P3 and the fourth pattern portion P4.

The third pattern portion P3 and the fourth pattern portion P4 may be disposed to be spaced apart from each other by a set size in the first direction 1D. In detail, a second space S2 between the third pattern portion P3 and the fourth pattern portion P4 may be 300 μm or less. In more detail, the second space S2 between the third pattern portion P3 and the fourth pattern portion P4 may be 100 μm to 300 μm.

In addition, the second space S2 may have a size equal to or similar to that of the first space S1 within the above range.

When the second space S2 exceeds 300 μm or is less than 100 μm, a distance between the third pattern portion P3 and the fourth pattern portion P4 becomes too large or small, and thus it is not possible to easily and precisely control the position of the end of the protective layer.

In addition, the third pattern portion P3 and the fourth pattern portion P4 may have a length L2 and a width W2 of a set size. For example, the length L2 and the width W2 of the third pattern portion P3 and the fourth pattern portion P4 may be 20 μm to 50 μm.

In addition, the length L2 and the width W2 of the third pattern portion P3 and the fourth pattern portion P4 may be equal to or similar to the length L1 and the width W1 of the first pattern portion P1 and the second pattern portion P2 within the above range.

When the length L2 and the width W2 of the third pattern portion P3 and the fourth pattern portion P4 are less than 20 μm, the third pattern portion P3 and the fourth pattern portion P4 may not be easy to implement, and when the length L2 and the width W2 of the third pattern portion P3 and the fourth pattern portion P4 exceed 50 μm, a space between the third pattern portion P3 and the fourth pattern portion P4 and another adjacent circuit pattern or the dummy pattern is narrowed, so that a short-circuit or the like occurs, and thus electrical characteristics may be deteriorated.

The third outer pattern OP3 may include a plurality of pattern portions. In detail, the third outer pattern OP3 may include a fifth pattern portion P5 and a sixth pattern portion P6. The fifth pattern portion P5 and the sixth pattern portion P6 may be disposed to extend in one direction. In addition, the fifth pattern portion P5 and the sixth pattern portion P6 may be disposed to extend in the same direction. That is, the fifth pattern portion P5 and the sixth pattern portion P6 may be embossed portions that extend and protrude from the third outer pattern OP3 in one direction.

For example, the fifth pattern portion P5 and the sixth pattern portion P6 may be disposed to extend inward. That is, the fifth pattern portion P5 and the sixth pattern portion P6 may be disposed to extend in the direction of the third end E3 of the substrate 100.

The fifth pattern portion P5 and the sixth pattern portion P6 may be disposed to be spaced apart from each other. In detail, the fifth pattern portion P5 and the sixth pattern portion P6 may be disposed to be spaced apart from each other in the first direction 1D. In addition, the sixth end E6 of the protective layer 300 may pass between the fifth pattern portion P5 and the sixth pattern portion P6. That is, the sixth end E6 of the protective layer 300 may be disposed between the fifth pattern portion P5 and the sixth pattern portion P6.

The fifth pattern portion P5 and the sixth pattern portion P6 may be disposed to be spaced apart from each other by a set size in the first direction 1D. In detail, a third space S3 between the fifth pattern portion P5 and the sixth pattern portion P6 may be 300 μm or less. In more detail, the third space S3 between the fifth pattern portion P5 and the sixth pattern portion P6 may be 100 μm to 300 μm.

In addition, the third space S3 may have a size equal to or similar to those of the first space S1 and the second space S2 within the above range.

When the third space S3 exceeds 300 μm or is less than 100 μm, a distance between the fifth pattern portion P5 and the sixth pattern portion P6 becomes too large or small, and thus it is not possible to easily and precisely control the position of the end of the protective layer.

In addition, the fifth pattern portion P5 and the sixth pattern portion P6 may have a length L3 and a width W3 of a set size. For example, the length L3 and the width W3 of the fifth pattern portion P5 and the sixth pattern portion P6 may be 20 μm to 50 μm.

In addition, the length L3 and the width W3 of the fifth pattern portion P5 and the sixth pattern portion P6 may be equal to or similar to the length L1 and the width W1 of the first pattern portion P1 and the second pattern portion P2 and the length L2 and the width W2 of the third pattern portion P3 and the fourth pattern portion P4 within the above range.

When the length L3 and the width W3 of the fifth pattern portion P5 and the sixth pattern portion P6 are less than 20 μm, the fifth pattern portion P5 and the sixth pattern portion P6 may not be easy to implement, and when the length L3 and the width W3 of the fifth pattern portion P5 and the sixth pattern portion P6 exceed 50 μm, a space between the fifth pattern portion P5 and the sixth pattern portion P6 and another adjacent circuit pattern or the dummy pattern is narrowed, so that a short-circuit or the like occurs, and thus electrical characteristics may be deteriorated.

The fourth outer pattern OP4 may include a plurality of pattern portions. In detail, the fourth outer pattern OP4 may include a seventh pattern portion P7 and an eighth pattern portion P8. The seventh pattern portion P7 and the eighth pattern portion P8 may be disposed to extend in one direction. In addition, the seventh pattern portion P7 and the eighth pattern portion P8 may be disposed to extend in the same direction. That is, the seventh pattern portion P7 and the eighth pattern portion P8 may be embossed portions that extend and protrude from the fourth outer pattern OP4 in one direction.

In addition, the seventh pattern portion P7 and the eighth pattern portion P8 may be disposed to extend in the same or opposite directions to the fifth pattern portion P5 and the sixth pattern portion P6.

For example, the seventh pattern portion P7 and the eighth pattern portion P8 may be disposed to extend inward. That is, the seventh pattern portion P7 and the eighth pattern portion P8 may be disposed to extend in the direction of the fourth end E4 of the substrate 100.

The seventh pattern portion P7 and the eighth pattern portion P8 may be disposed to be spaced apart from each other. In detail, the seventh pattern portion P7 and the eighth pattern portion P8 may be disposed to be spaced apart from each other in the first direction 1D. In addition, the sixth end E6 of the protective layer 300 may pass between the seventh pattern portion P7 and the eighth pattern portion P8. That is, the sixth end E6 of the protective layer 300 may be disposed between the seventh pattern portion P7 and the eighth pattern portion P8. In other words, the sixth end E6 of the protective layer 300 may be disposed between the fifth pattern portion P5 and the sixth pattern portion P6 and between the seventh pattern portion P7 and the eighth pattern portion P8.

The seventh pattern portion P7 and the eighth pattern portion P8 may be disposed to be spaced apart from each other by a set size in the first direction 1D. In detail, a fourth space S4 between the seventh pattern portion P7 and the eighth pattern portion P8 may be 300 μm or less. In more detail, the fourth space S4 between the seventh pattern portion P7 and the eighth pattern portion P8 may be 100 μm to 300 μm.

In addition, the fourth space S4 may have a size equal to or similar to those of the first space S1, the second space S2, and the third space S3 within the above range.

When the fourth space S4 exceeds 300 μm or is less than 100 μm, a distance between the seventh pattern portion P7 and the eighth pattern portion P8 becomes too large or small, and thus it is not possible to easily and precisely control the position of the end of the protective layer.

In addition, the seventh pattern portion P7 and the eighth pattern portion P8 may have a length L4 and a width W4 of a set size. For example, the length L4 and the width W4 of the seventh pattern portion P7 and the eighth pattern portion P8 may be 20 μm to 50 μm.

In addition, the length L4 and the width W4 of the seventh pattern portion P7 and the eighth pattern portion P8 may be equal to or similar to the length L1 and the width W1 of the first pattern portion P1 and the second pattern portion P2, the length L2 and the width W2 of the third pattern portion P3 and the fourth pattern portion P4, and the length L3 and the width W3 of the fifth pattern portion P5 and the sixth pattern portion P6.

When the length L4 and the width W4 of the seventh pattern portion P7 and the eighth pattern portion P8 are less than 20 μm, the seventh pattern portion P7 and the eighth pattern portion P8 may not be easy to implement, and when the length L4 and the width W4 of the seventh pattern portion P7 and the eighth pattern portion P8 exceed 50 μm, a space between the seventh pattern portion P7 and the eighth pattern portion P8 and another adjacent circuit pattern or the dummy pattern is narrowed, so that a short-circuit or the like occurs, and thus electrical characteristics may be deteriorated.

A flexible printed circuit board according to a first embodiment may include a plurality of outer patterns, and each of the outer patterns may include a plurality of pattern portions spaced apart from each other.

Accordingly, when the protective layer 300 is disposed, it is possible to easily control a position of the protective layer in the first direction.

That is, the position of the protective layer may be adjusted so that an end of the protective layer 300 is disposed between the pattern portions. Therefore, the position of the protective layer may be easily controlled to a position to be implemented by the pattern portion.

Therefore, it is possible to inhibit the bonding regions of the first circuit pattern and the second circuit pattern from decreasing due to disposition of the position of the protective layer beyond the position to be implemented. In addition, it is possible to inhibit a region in which the protective layer is not disposed in the wiring portion from occurring due to disposition of the position of the protective layer below the position to be implemented.

Accordingly, the flexible printed circuit board according to the embodiment may easily control the position of the protective layer by the plurality of pattern portions formed on the outer pattern. Therefore, the flexible printed circuit board according to the embodiment may improve bonding characteristics and have improved reliability by inhibiting corrosion of circuit patterns.

Meanwhile, in the above description, it has been described that the pattern portions of the outer pattern are formed in an embossed shape extending in one direction, but the embodiment is not limited thereto.

Figure 6:
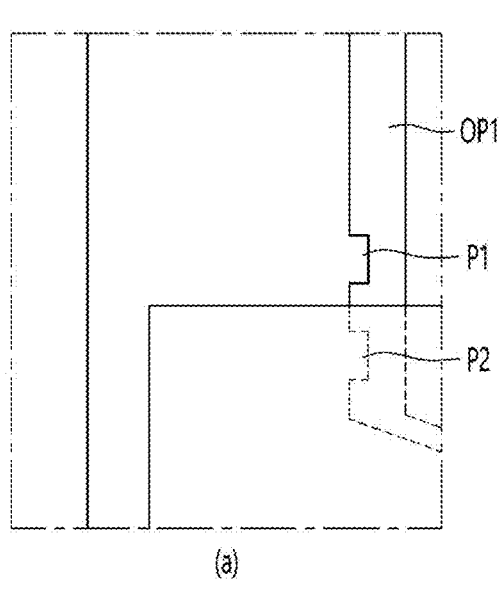
FIG. 6 is various enlarged views region A in FIG. 1.
Figure 6:
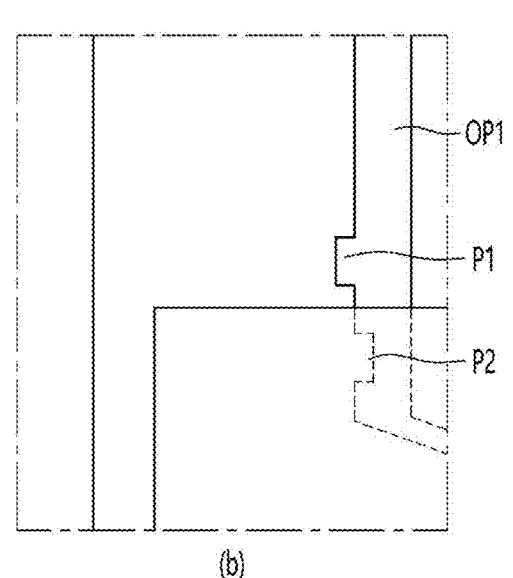
Figure 6:
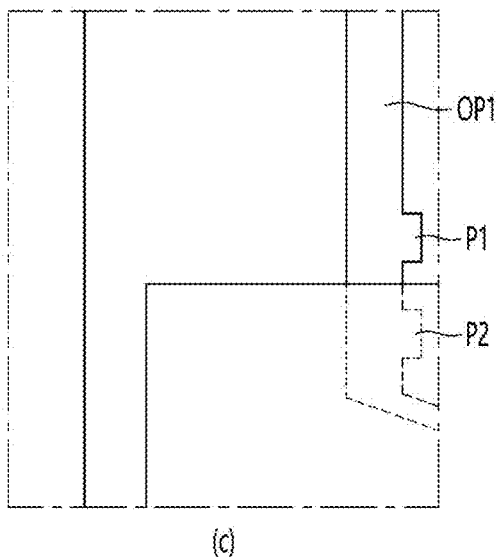
Figure 6:
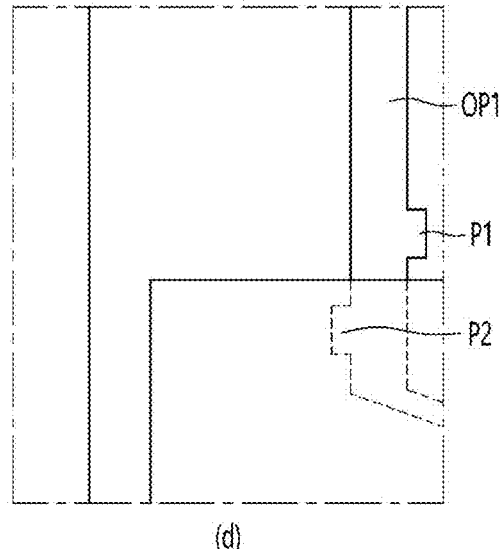

FIG. 6 is a view for describing various shapes of a pattern portion of the first outer pattern OP1. Although only a shape of the pattern portion of the first outer pattern OP1 is illustrated in FIG. 6, it is possible to similarly apply to a pattern portion of the second outer pattern OP2 facing the first outer pattern OP1 in the second direction.

Referring to FIG. 6, the first pattern portion P1 and the second pattern portion P2 of the first outer pattern OP1 may be formed in a shape of an engraved portion formed in an inner region of the first outer pattern OP1. ((a) in FIG. 6)

Alternatively, referring to FIG. 6, any one of the first pattern portion P1 and the second pattern portion P2 of the first outer pattern OP1 may be formed in a shape of an embossed portion, and the other pattern portion may be formed in the shape of the engraved portion. ((b) in FIG. 6)

Alternatively, referring to FIG. 6, the first pattern portion P1 and the second pattern portion P2 of the first outer pattern OP1 may be formed in the shape of the embossed portion that protrudes and extends in the direction of the fourth end E4 of the substrate 100. Alternatively, in case of the second outer pattern OP2, the third pattern portion P3 and the fourth pattern portion P4 may be formed in the shape of the embossed portion that protrudes and extends in the direction of the third end E3 of the substrate 100. ((c) in FIG. 6)

Alternatively, referring to FIG. 6, any one of the first pattern portion P1 and the second pattern portion P2 of the first outer pattern OP1 may protrude in the direction of the third end E3 of the substrate 100, and the other pattern portion may protrude in the direction of the fourth end E4 of the substrate 100. That is, the plurality of pattern portions of the outer pattern may be disposed to extend in different directions. ((d) in FIG. 6)

Figure 7:
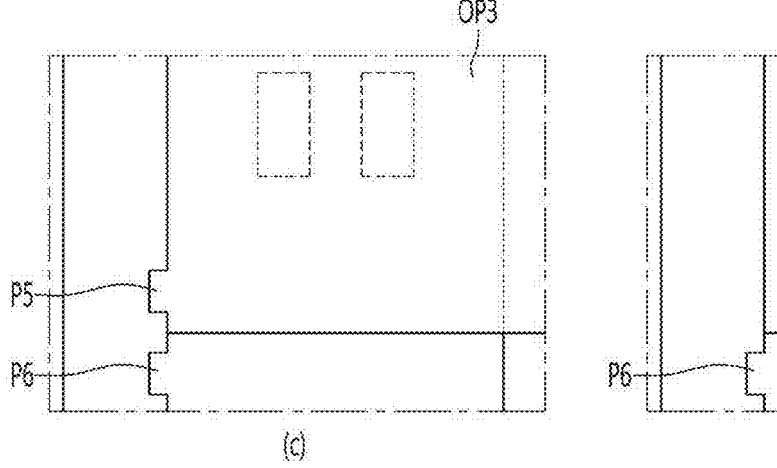
FIG. 7 is various enlarged views region B in FIG. 1.
Figure 7:
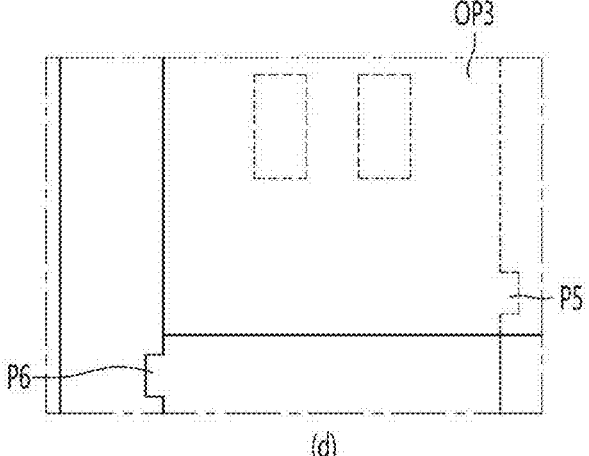

FIG. 7 is a view for describing various shapes of a pattern portion of the third outer pattern OP3. Although only a shape of the pattern portion of the third outer pattern OP3 is illustrated in FIG. 7, it is possible to similarly apply to a pattern portion of the fourth outer pattern OP4 facing the third outer pattern OP3 in the second direction.

Referring to FIG. 7, the fifth pattern portion P5 and the sixth pattern portion P6 of the third outer pattern OP3 may be formed in the shape of the engraved portion formed in an inner region of the third outer pattern OP3. ((a) in FIG. 7)

Alternatively, referring to FIG. 7, any one of the fifth pattern portions P5 and the sixth pattern portion P6 of the third outer pattern OP3 may be formed in the shape of the embossed portion, and the other pattern portion may be formed in the shape of the engraved portion. ((b) in FIG. 7)

Alternatively, referring to FIG. 7, the fifth pattern portion P5 and the sixth pattern portion P6 of the third outer pattern OP3 OP1 may be formed in the shape of the embossed portion that protrudes and extends in the direction of the third end E3 of the substrate 100 and extend. Alternatively, in case of the fourth outer pattern OP4, the seventh pattern portion P7 and the eighth pattern portion P8 may be formed in the shape of the embossed portion that protrudes and extends in the direction of the fourth end E4 of the substrate 100. ((c) in FIG. 7)

Alternatively, referring to FIG. 7, any one of the fifth pattern portion P5 and the sixth pattern portion P6 of the third outer pattern OP3 may protrude in the direction of the third end E3 of the substrate 100, and the other pattern portion may protrude in the direction of the fourth end E4 of the substrate 100. That is, the plurality of pattern portions of the outer pattern may be disposed to extend in different directions. ((d) in FIG. 7)

Meanwhile, the first pattern portion P1, the second pattern portion P2, the third pattern portion P3, the fourth pattern portion P4, the fifth pattern portion P5, the sixth pattern portion P6, the seventh pattern portion P7, and the eighth pattern portion P8 may extend in a direction of a circuit pattern or a dummy pattern adjacent to the outer pattern.

In this case, the pattern portion of the outer pattern may be disposed to be spaced apart from the adjacent pattern by a set space in order to inhibit a short-circuit between the outer pattern and the adjacent circuit pattern or dummy pattern. In detail, at least one of the first pattern portion P1, the second pattern portion P2, the third pattern portion P3, the fourth pattern portion P4, the fifth pattern portion P5, the sixth pattern portion P6, the seventh pattern portion P7, and the eighth pattern portion P8 may be spaced apart from the circuit pattern or the dummy pattern adjacent to the outer pattern by a space of 20 μm or less, preferably a space of 15 μm or less, and more preferably a space of 10 μm or less.

Accordingly, it is possible to inhibit a short-circuit between the pattern portion of the outer pattern and the adjacent patterns.

Hereinafter, a flexible printed circuit board according to a second embodiment will be described with reference to FIGS. 8 and 9.

Figure 8:
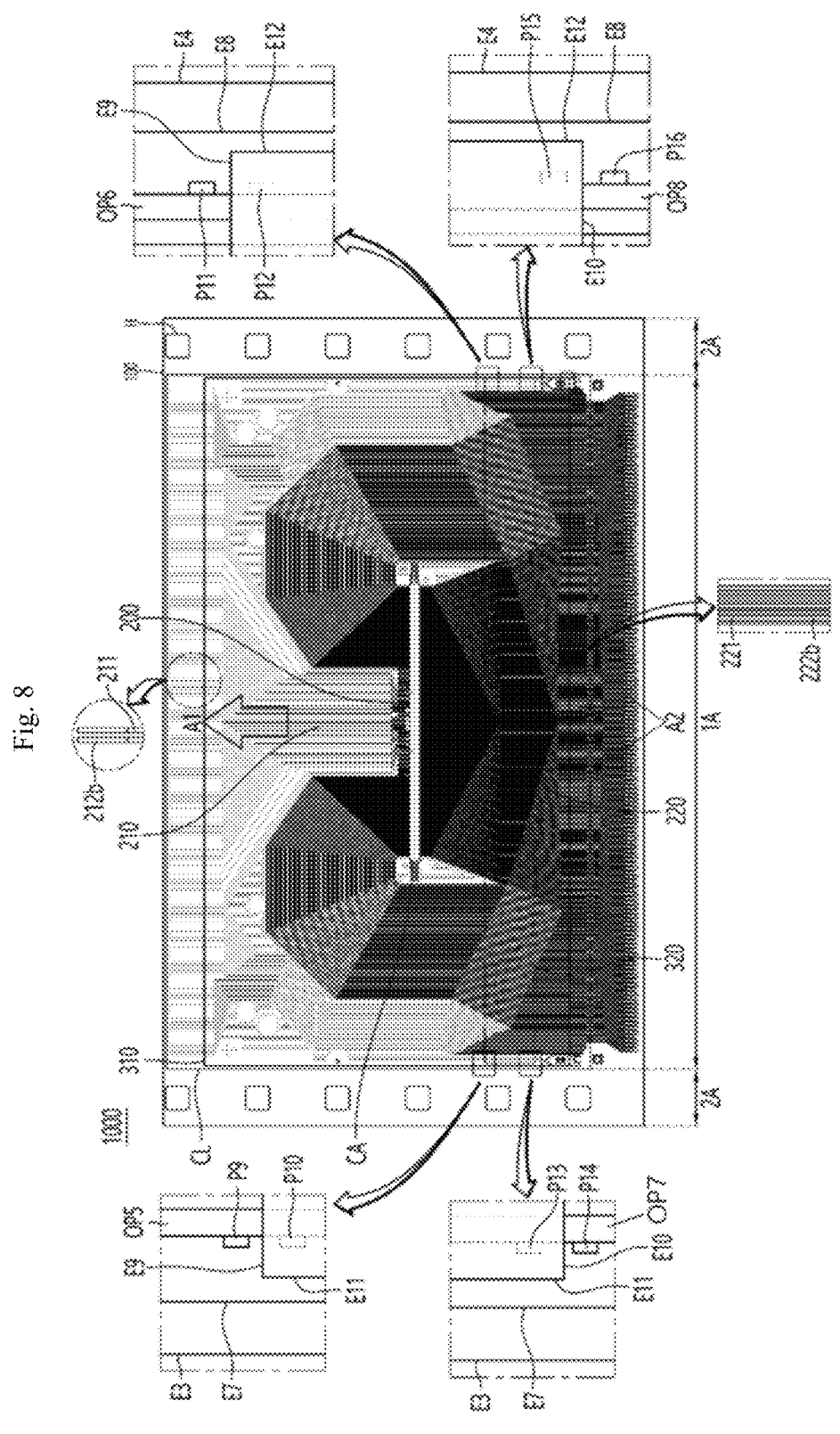
FIG. 8 is a top view of a flexible printed circuit board according to a second embodiment.
Figure 9:
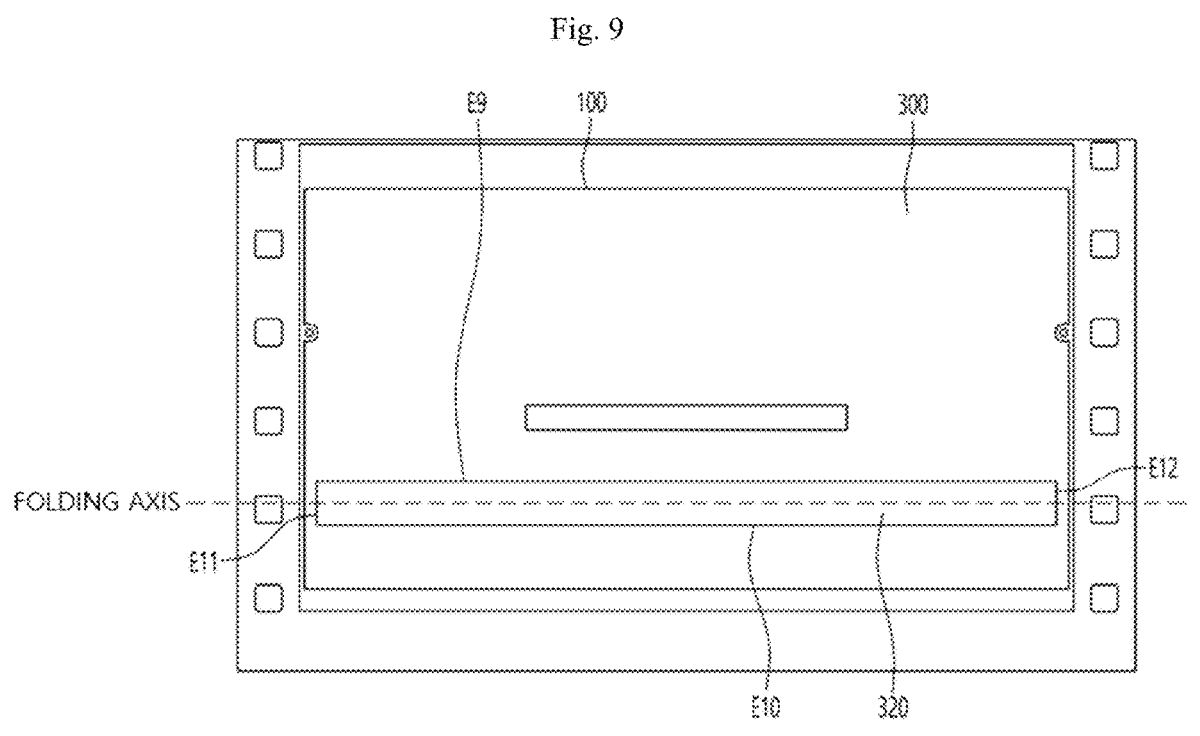

Referring to FIGS. 8 and 9, the flexible printed circuit board according to the second embodiment may further include a fifth outer pattern OP5, a sixth outer pattern OP6, a seventh outer pattern OP7, and an eighth outer pattern OP8 unlike the first embodiment described above.

In addition, the flexible printed circuit board 1000 may include a protective layer formed of two layers. In detail, the flexible printed circuit board 1000 may include a first protective layer 310 and a second protective layer 320 on the first protective layer 310.

For example, the first protective layer 310 may be disposed at the same position as the above-described protective layer 300. That is, the first protective layer 310 may be disposed on the wiring portion of the circuit pattern. In addition, the second protective layer 320 may be disposed on a bending region of the flexible printed circuit board 1000. In detail, the second protective layer 320 may be disposed on a folding region adjacent to a folding axis formed when the flexible printed circuit board is folded.

The second protective layer 320 may include a plurality of ends. In detail, the second protective layer 320 may include a ninth end E9, a tenth end E10, an eleventh end E11, and a twelfth end E12. For example, the second protective layer 320 may include the ninth end E9 spaced apart from the first end E1 of the substrate 100 and disposed to directly face to each other, the tenth end E10 spaced apart from the second end E2 of the substrate 100 and disposed to directly face to each other, the eleventh end E11 spaced apart from the third end E3 of the substrate 100 and disposed to directly face to each other, and the twelfth end E12 spaced apart from the fourth end E4 of the substrate 100 and disposed to directly face to each other.

In addition, the ninth end E9, the tenth end E10, the eleventh end E11, and the twelfth end E12 may be disposed to be spaced apart from an end of the first protective layer 310.

In addition, the ninth end E9 and the tenth end E10 may be disposed to face each other, and the eleventh end E11 and the twelfth end E12 may be connected to the ninth end E9 and the tenth end E10, respectively and disposed to face each other.

That is, the ninth end E9 and the tenth end E10 may be disposed to face each other in the first direction 1D, and the eleventh end E11 and the twelfth end E12 may be disposed to face each other in the second direction 2D.

The fifth outer pattern OP5 and the sixth outer pattern OP6 may be disposed to face each other in the second direction 2D. In addition, the seventh outer pattern OP7 and the eighth outer pattern OP8 may be disposed to face each other in the second direction 2D.

The fifth outer pattern OP5 and the seventh outer pattern OP7 may be disposed between the first outer pattern OP1 and the third outer pattern OP3 in the first direction. That is, the fifth outer pattern OP5 and the seventh outer pattern OP7 may be disposed to be spaced apart from each other in the first direction 1D.

The sixth outer pattern OP6 and the eighth outer pattern OP8 may be disposed between the second outer pattern OP2 and the fourth outer pattern OP4 in the first direction. That is, the sixth outer pattern OP6 and the eighth outer pattern OP8 may be disposed to be spaced apart from each other in the first direction 1D.

At least one of the fifth outer pattern OP5, the sixth outer pattern OP6, the seventh outer pattern OP7, and the eighth outer pattern OP8 may be integrally formed with at least one of the first outer pattern OP1, the second outer pattern OP2, the third outer pattern OP3, and the fourth outer pattern OP4.

Alternatively, at least one of the fifth outer pattern OP5, the sixth outer pattern OP6, the seventh outer pattern OP7, and the eighth outer pattern OP8 may be formed to separate from at least one of the first outer pattern OP1, the second outer pattern OP2, the third outer pattern OP3, and the fourth outer pattern OP4.

The fifth outer pattern OP5 may include a ninth pattern portion P9 and a tenth pattern portion P10, the sixth outer pattern OP6 may include an eleventh pattern portion P11 and a twelfth pattern portion P12, the seventh outer pattern OP7 may include a thirteenth pattern portion P13 and a fourteenth pattern portion P14, and the eighth outer pattern OP8 may include a fifteenth pattern portion P15 and a sixteenth pattern portion P16.

The ninth pattern portion P9, the tenth pattern portion P10, the eleventh pattern portion P11, the twelfth pattern portion P12, the thirteenth pattern portion P13, the fourteenth pattern portion P14, the fifteenth pattern portion P15, and the sixteenth pattern portion P16 may be formed in a shape and size (width and length) the same as or similar to those of the first pattern portion P1 to the eighth pattern portion P8 described above.

That is, the ninth pattern portion P9, the tenth pattern portion P10, the eleventh pattern portion P11, the twelfth pattern portion P12, the thirteenth pattern portion P13, and the fourteenth pattern portion P14, the fifteenth pattern portion P15, and the sixteenth pattern portion P16 may be formed in at least one shape of the embossed portion and the engraved portion and may extend in the direction of the third end E3 and the fourth end E4 of the substrate.

In addition, the ninth pattern portion P9 and the tenth pattern portion P10, the eleventh pattern portion P11 and the twelfth pattern portion P12, the thirteenth pattern portion P13 and the fourteenth pattern portion P14, the fifteenth pattern portion P15, and the sixteenth pattern portion P16 may be disposed to be spaced apart from each other in the first direction, and each space may be spaced apart by a space the same as or similar to those of the first pattern portion P1 to the eighth pattern portion P8 described above.

In detail, the ninth pattern portion P9 and the tenth pattern portion P10 may be disposed to be spaced apart from each other in the first direction 1D. In addition, the ninth end E9 of the second protective layer 320 may pass between the ninth pattern portion P9 and the tenth pattern portion P10. That is, the ninth end E9 of the second protective layer 320 may be disposed between the ninth pattern portion P9 and the tenth pattern portion P10.

In addition, the eleventh pattern portion P11 and the twelfth pattern portion P12 may be disposed to be spaced apart from each other in the first direction 1D. In addition, the ninth end E9 of the second protective layer 320 may pass between the eleventh pattern portion P11 and the twelfth pattern portion P12. That is, the ninth end E9 of the second protective layer 320 may be disposed between the eleventh pattern portion P11 and the twelfth pattern portion P12.

In other words, the ninth end E9 of the second protective layer 320 may be disposed between the ninth pattern portion P9 and the tenth pattern portion P10 and between the eleventh pattern portion P11 and the twelfth pattern portion P12.

In addition, the thirteenth pattern portion P13 and the fourteenth pattern portion P14 may be disposed to be spaced apart from each other in the first direction 1D. In addition, the tenth end E10 of the second protective layer 320 may pass between the thirteenth pattern portion P13 and the fourteenth pattern portion P14. That is, the tenth end E10 of the second protective layer 320 may be disposed between the thirteenth pattern portion P13 and the fourteenth pattern portion P14.

In addition, the fifteenth pattern portion P15 and the sixteenth pattern portion P16 may be disposed to be spaced apart from each other in the first direction 1D. In addition, the tenth end E10 of the second protective layer 320 may pass between the fifteenth pattern portion P15 and the sixteenth pattern portion P16. That is, the tenth end E10 of the second protective layer 320 may be disposed between the fifteenth pattern portion P15 and the sixteenth pattern portion P16.

In other words, the tenth end E10 of the second protective layer 320 may be disposed between the thirteenth pattern portion P13 and the fourteenth pattern portion P14 and between the fifteenth pattern portion P15 and the sixteenth pattern portion P16.

The flexible printed circuit board according to the second embodiment may further include the second protective layer disposed on the first protective layer. That is, two protective layers may be disposed in one region of the flexible printed circuit board. That is, the two protective layers may be disposed in the bending region of the flexible printed circuit board.

Accordingly, it is possible to inhibit cracks from occurring in the flexible printed circuit board due to stress generated when the flexible printed circuit board is bent.

In addition, the flexible printed circuit board may include a plurality of outer patterns, and each of the outer patterns may include a plurality of pattern portions spaced apart from each other.

Accordingly, when the second protective layer 320 is disposed, it is possible to easily control a position of the second protective layer in the first direction.

That is, the position of the second protective layer may be adjusted so that an end of the second protective layer 320 is disposed between the pattern portions. Therefore, the position of the second protective layer may be easily controlled to a position to be implemented by the pattern portion.

Therefore, it is possible to inhibit an unnecessary protective layer from further being disposed due to disposition of the position of the second protective layer beyond the position to be implemented. In addition, it is possible to inhibit the flexible printed circuit board from being deformed by stress generated in the bending region due to disposition of the position of the second protective layer below the position to be implemented.

Accordingly, the flexible printed circuit board according to the first embodiment may easily control the position of the protective layer by the plurality of pattern portions formed on the outer pattern. Therefore, the flexible printed circuit board according to the embodiment may improve the bonding characteristics and have the improved reliability.

Meanwhile, a flexible printed circuit board of a one-metal COF in which the first circuit pattern and the second circuit pattern are disposed only on one surface of the substrate has been described in the above description, but the embodiment is not limited thereto.

In detail, the first circuit pattern and the second circuit pattern may be disposed on both one surface of the substrate and the other surface opposite to the one surface.

That is, the flexible printed circuit board according to the embodiment may be a two-metal COF in which the circuit patterns are disposed on both surfaces of the substrate 100.

For example, the first circuit pattern 210 and the second circuit pattern 220 may be connected to the chip of the chip mounting region CA on a first surface of the substrate 100. In addition, the first circuit pattern 210 and the second circuit pattern 220 may be connected to the external printed circuit board and the display panel on a second surface of the substrate 100.

In addition, a plurality of vias formed to pass through the first surface and the second surface may be formed in the substrate 100, and the circuit patterns disposed on the first surface and the second surface of the substrate may be electrically connected through the vias.

That is, the first circuit pattern 210 and the second circuit pattern 220 may be disposed on both surfaces of the substrate 100 to separate the surface on which the chip, the printed circuit board, and the display panel are connected.

When the circuit patterns are disposed on both surfaces of the substrate 100, the protective layer disposed on the circuit pattern may also be disposed on both surfaces of the substrate 100.

Therefore, when the flexible printed circuit board is the two-metal COF, a plurality of outer patterns including at least two pattern portions may be disposed on the first surface of the substrate, and a plurality of outer patterns including at least two pattern portions on the first surface of the substrate may also be disposed on the second surface of the substrate.

In addition, when the two protective layers are disposed on any one of the first surface and the second surface, a plurality of outer patterns including at least two pattern portions may be further disposed on the surface on which the two-layer protective layer is disposed.

Accordingly, even when the flexible printed circuit board is the 2-metal COF, the position of the protective layer disposed on one surface and the other surface of the substrate may be appropriately disposed at the position to be implemented.

Figure 10:
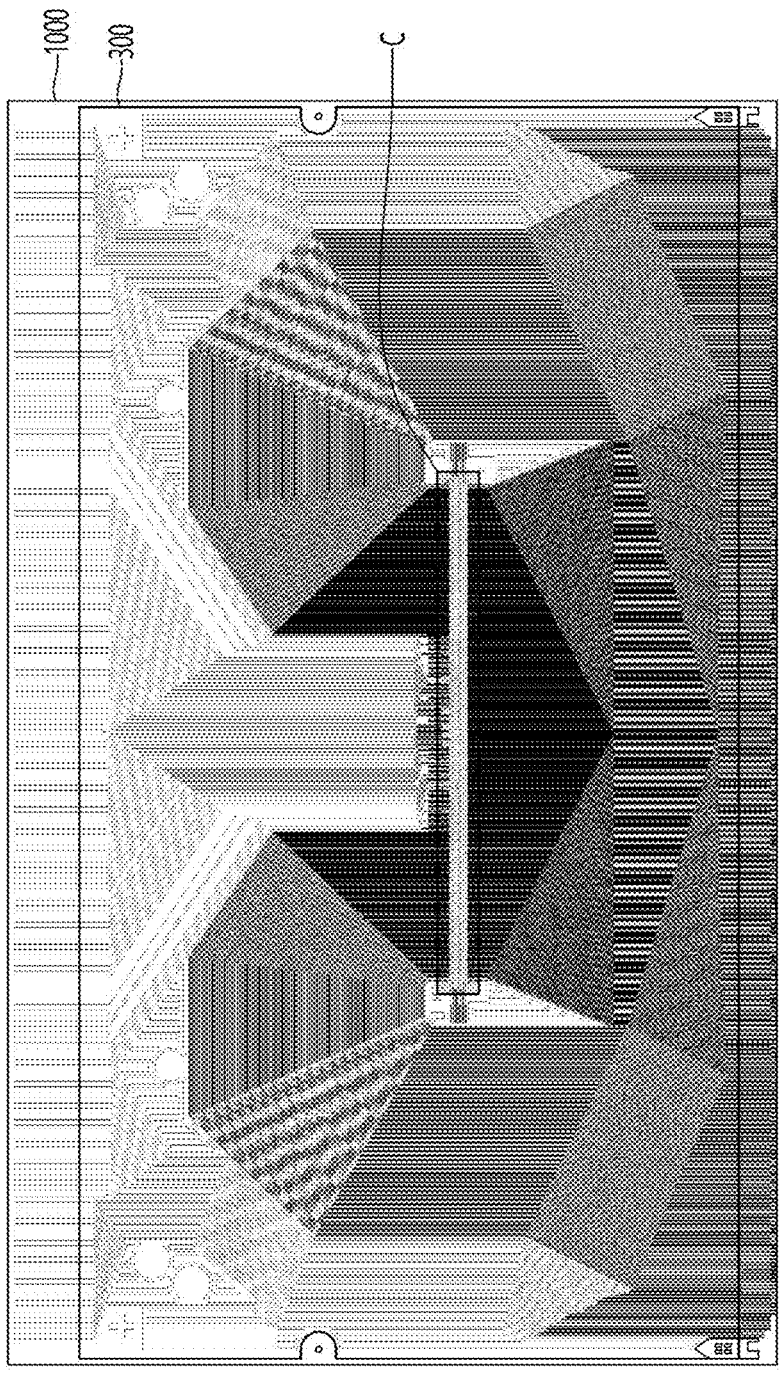
FIG. 10 is a top view of a COF module according to an embodiment.

FIG. 10 is a top view of a COF module according to an embodiment.

Referring to FIG. 10, the COF module according to the embodiment may include the flexible printed circuit board described above and the chip C disposed in the chip mounting region CA of the flexible printed circuit board 1000.

In addition, the flexible printed circuit board 1000 may include the above-described protective layer 300.

Meanwhile, the COF module may be manufactured by cutting the second region 2A of the flexible printed circuit board 1000 and then mounting the chip C. In detail, after cutting the boundary line CL between the first region 1A and the second region 2A of FIG. 1, a COF module 2000 may be manufactured, in which a driving chip electrically connected to the first circuit pattern and the second circuit pattern and disposed in the chip mounting region of the flexible printed circuit board is mounted.

For example, after testing driving characteristics of the flexible printed circuit board through the wiring and the pad disposed outside the cutting line CL of the flexible printed circuit board, the flexible printed circuit board may be cut along the cutting line CL.

The COF module may be positioned between the display panel and the substrate to connect an electrical signal.

That is, pad portions of the first circuit pattern and the second circuit pattern that are exposed without the protective layer 300 being disposed may be connected to the display panel and the printed circuit board, and the third circuit pattern in the chip mounting region may be connected to the chip.

Figure 11:
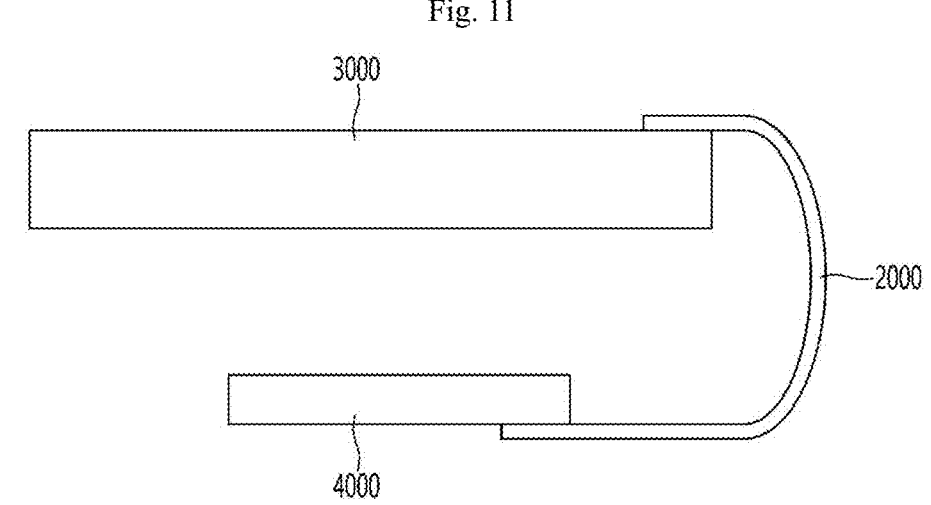
FIG. 11 is a cross-sectional view illustrating a connection relationship of the COF module including the flexible printed circuit board according to the embodiment.

Referring to FIG. 11, one end of the COF module 2000 including the flexible printed circuit board according to the embodiment may be connected to a display panel 3000, and the other end opposite to the one end may be connected to a printed circuit board 4000.

For example, one end of the COF module 2000 including the flexible printed circuit board according to the embodiment may be electrically connected by being in contact with the display panel 3000, and the other end opposite to the one end may be electrically connected by being in contact with the printed circuit board 4000. Here, the contact may refer to a direct contact. Alternatively, it may refer to contacting with an anisotropic conductive film (ACF) interposed therebetween.

As an example, the ACF may be disposed between the COF module 2000 and the printed circuit board 4000. The COF module 2000 and the printed circuit board 4000 may be electrically connected while being adhered by the ACF. The ACF may be a resin in which conductive particles are dispersed. Therefore, the electrical signal connected by the printed circuit board 4000 may be transmitted to the COF module 2000 through the conductive particles included in the ACF.

Since the COF module 2000 includes a flexible substrate, it may have a rigid shape or a bent shape between the display panel 3000 and the printed circuit board 4000.

The COF module 2000 may connect between the display panel 3000 and the printed circuit board 4000 disposed opposite to each other in a bent shape, thereby reducing a thickness of the electronic device and improving the degree of freedom in design. In addition, since the COF module 2000 including the flexible substrate may not be disconnected even in the bent shape, the reliability of the electronic device including the COF module may be improved.

Since the COF module is flexible, it may be used in various electronic devices.

Figure 12:
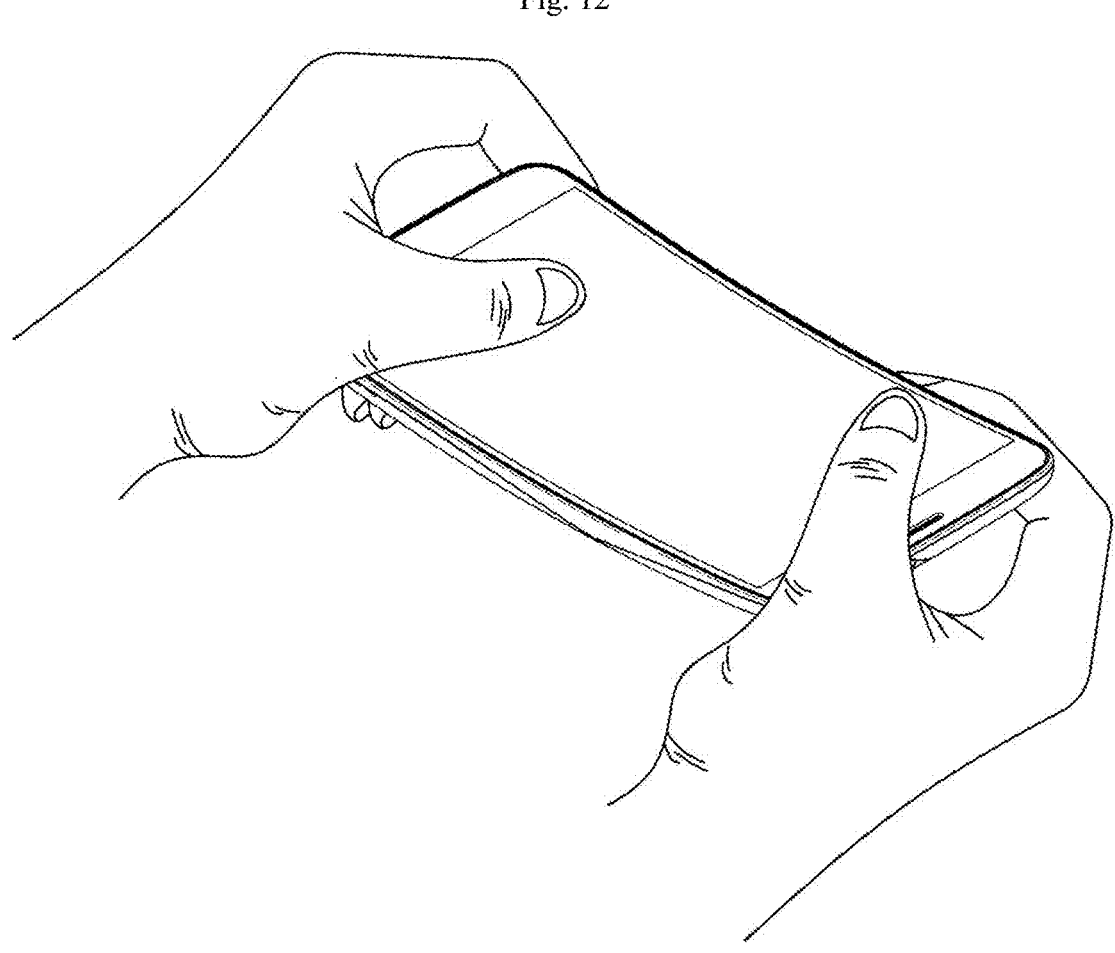
FIGS. 12 to 14 are views of an electronic device including the flexible printed circuit board according to the embodiment.

For example, referring to FIG. 12, the COF module may be included in a bendable flexible touch window. Therefore, a touch device including the same may be a flexible touch device. Therefore, a user may bend or fold it by hand. Such a flexible touch window may be applied to a wearable touch or the like.

Figure 13:
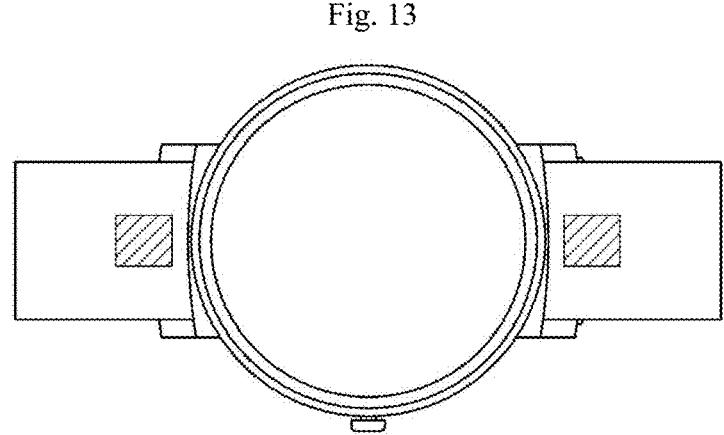

Referring to FIG. 13, the COF module may be included in various wearable touch devices including a curved display. Therefore, an electronic device including the COF module may be reduced in thickness or weight.

Figure 14:
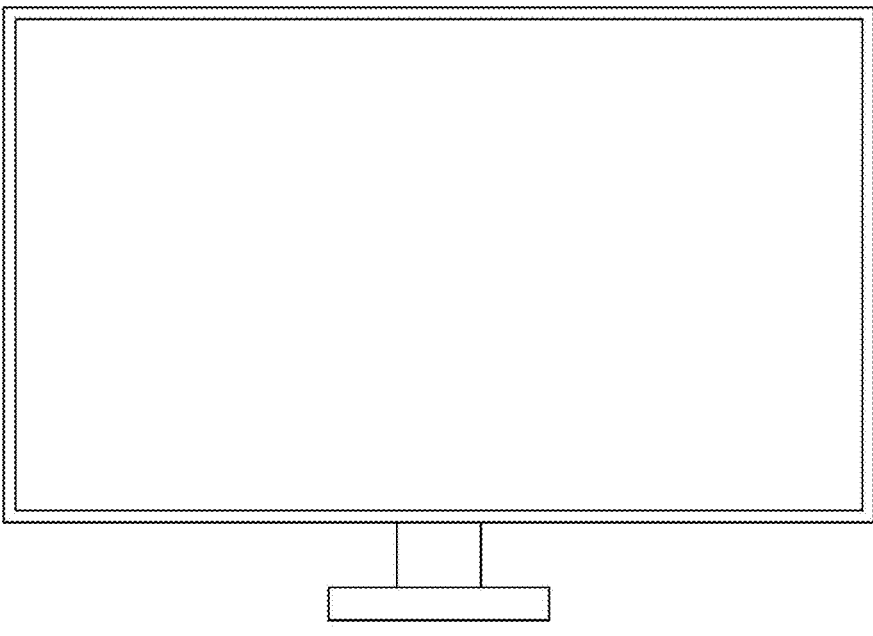

Referring to FIG. 14, the COF module may be used for various electronic devices having a display portion such as a TV, a monitor, and a laptop. In this case, the COF module may be used for an electronic device having a curved-shaped display portion However, the embodiment is not limited thereto, and of course, such a COF flexible printed circuit board and a COF module obtained by processing the same may be used for various electronic devices.

The characteristics, structures and effects described in the embodiments above are included in at least one embodiment but are not limited to one embodiment. Furthermore, the characteristic, structure, and effect illustrated in each embodiment may be combined or modified for other embodiments by a person skilled in the art. Thus, it should be construed that contents related to such a combination and such a modification are included in the scope of the present disclosure.

In addition, embodiments are mostly described above, but the embodiments are merely examples and do not limit the present disclosure, and a person skilled in the art may appreciate that several variations and applications not presented above may be made without departing from the essential characteristic of embodiments. For example, each component specifically represented in the embodiments may be varied. In addition, it should be construed that differences related to such a variation and such an application are included in the scope of the present disclosure defined in the following claims.

What is claimed is:

1. A flexible circuit board comprising:
a substrate;
a conductive pattern disposed on the substrate; and
a protective layer disposed on the conductive pattern, wherein an upper surface of the substrate includes a first edge and a second edge facing along a first direction and each extending along a second direction perpendicular to the first direction,
wherein a lower surface of the protective layer includes a fifth edge positioned adjacent to the first edge, and a sixth edge facing the fifth edge along the first direction and positioned adjacent to the second edge,
wherein the first edge and the fifth edge are spaced apart from each other along the first direction, and
wherein the conductive pattern comprises a first outer pattern extending along the first direction including at least a portion disposed between the first edge and the fifth edge and having a part having a varying width in the second direction between the first edge and the fifth edge.

2. The flexible circuit board of claim 1, wherein the protective layer includes a through hole provided between the fifth edge and the sixth edge and extending along the second direction.

3. The flexible circuit board of claim 1, wherein the first edge is located farther from the second edge than from the fifth edge.

4. The flexible circuit board of claim 3, wherein the first outer pattern includes:
a first pattern region provided between the first edge and the fifth edge and non-overlapping with the protective layer along a vertical direction, and
a second pattern region connected to the first pattern region and overlapping the protective layer along the vertical direction,
wherein the first pattern region includes:
a first portion having a first width in the second direction, and
a second portion having a second width greater than the first width in the second direction and non-overlapping with the fifth edge along the vertical direction.

5. The flexible circuit board of claim 4, wherein the second portion of the first pattern region is spaced apart from the first edge and the fifth edge along the first direction.

6. The flexible circuit board of claim 4, wherein the second portion includes a protrusion protruding further outward along the second direction than the first portion.

7. The flexible circuit board of claim 4, wherein the second pattern region includes:
a third portion having a third width in the second direction, and
a fourth portion having a fourth width greater than the third width in the second direction and non-overlapping with the fifth edge along the vertical direction.

8. The flexible circuit board of claim 7, wherein the fifth edge is provided between the second portion of the first pattern region and the fourth portion of the second pattern region.

9. The flexible circuit board of claim 7, wherein the first width and the third width are same, and
wherein the second width and the fourth width are same.

10. The flexible circuit board of claim 9, wherein the fourth portion includes a protrusion protruding further outward along the second direction than the third portion.

11. The flexible circuit board of claim 10, wherein the protrusion provided in the second portion and the protrusion provided in the fourth portion protrude in a same direction.

12. The flexible circuit board of claim 10, wherein the first outer pattern includes a 1-1 outer pattern and a 1-2 outer pattern spaced apart along the second direction, and
wherein the fifth edge is provided between second and fourth portions of the 1-1 outer pattern and between second and fourth portions of the 1-2 outer pattern.

13. The flexible circuit board of claim 12, wherein protrusions of the second and fourth portion of the 1-1 outer pattern and protrusions of the second and fourth portion of the 1-2 outer pattern protrude in opposite directions.

14. The flexible circuit board of claim 12, wherein the conductive pattern includes a plurality of first circuit patterns each including a first pad portion overlapping the through hole along a vertical direction, a second pad portion provided between the first edge and the fifth edge, and a first wiring portion connecting the first pad portion and the second pad portion, and wherein the plurality of first circuit patterns are provided to be spaced apart along the second direction between the 1-1 outer pattern and the 1-2 outer pattern.

15. The flexible circuit board of claim 8, wherein the second edge and the sixth edge are spaced apart from each other along the first direction, and wherein the conductive pattern comprises a second outer pattern including at least a portion disposed between the fifth edge and the sixth edge and having a part having different widths in the second direction from the second edge toward the sixth edge.

16. The flexible circuit board of claim 15, wherein the second outer pattern includes:

a third pattern region provided between the second edge and the sixth edge and non-overlapping with the protective layer along a vertical direction, and a fourth pattern region connected to the third pattern region and overlapping the protective layer along the vertical direction, wherein the third pattern region includes a fifth portion having a fifth width in the second direction, and a sixth portion having a sixth width greater than the fifth width in the second direction and non-overlapping with the sixth edge along the vertical direction, and wherein the fourth pattern region includes a seventh portion having a seventh width in the second direction, and an eighth portion having an eighth width greater than the seventh width in the second direction and non-overlapping with the sixth edge along the vertical direction.

17. The flexible circuit board of claim 16, wherein the sixth portion and the eighth portion of the second outer pattern are spaced apart from each other along the first direction, and wherein the sixth edge is provided between the sixth portion and the eighth portion.

18. The flexible circuit board of claim 16, wherein the conductive pattern comprises a plurality of second circuit patterns each including a third pad portion overlapping the through hole along a vertical direction, a fourth pad portion provided between the second edge and the sixth edge, and a second wiring portion connecting the third pad portion and the fourth pad portion, and wherein the second outer pattern includes a 2-1 outer pattern and a 2-2 outer pattern spaced apart from each other along the second direction with the plurality of second circuit patterns interposed therebetween.

19. A chip on film (COF) module comprising:

the flexible circuit board according to claim 18; and a chip arranged to overlap the through hole of the protective layer of the flexible circuit board in the vertical direction and connected to the first pad portion and the third pad portion.

20. An electronic device comprising:

the COF module according to claim 19, and a printed circuit board connected to the second pad portion of the first circuit pattern; and a display panel connected to the fourth pad portion of the second circuit pattern.

* * * * *